United States Patent
Yoshimi et al.

(10) Patent No.: US 9,214,406 B2
(45) Date of Patent: Dec. 15, 2015

(54) ELECTRONIC CONTROL DEVICE

(71) Applicant: DENSO CORPORATION, Kariya, Aichi-pref. (JP)

(72) Inventors: Tomoaki Yoshimi, Kariya (JP); Takayuki Uchida, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/578,561

(22) Filed: Dec. 22, 2014

(65) Prior Publication Data
US 2015/0187732 A1 Jul. 2, 2015

(30) Foreign Application Priority Data
Dec. 26, 2013 (JP) ................................ 2013-269339

(51) Int. Cl.
| | | |
|---|---|---|
| H01L 23/10 | (2006.01) | |
| H01L 23/34 | (2006.01) | |
| H01L 23/367 | (2006.01) | |
| H01L 25/065 | (2006.01) | |
| H01L 23/053 | (2006.01) | |
| H01L 23/24 | (2006.01) | |
| H01L 23/42 | (2006.01) | |
| H01L 23/00 | (2006.01) | |

(52) U.S. Cl.
CPC ............ *H01L 23/367* (2013.01); *H01L 23/053* (2013.01); *H01L 23/24* (2013.01); *H01L 23/34* (2013.01); *H01L 23/3675* (2013.01); *H01L 23/42* (2013.01); *H01L 24/32* (2013.01); *H01L 25/0655* (2013.01); *H01L 2924/0002* (2013.01); *H01L 2924/13055* (2013.01)

(58) Field of Classification Search
CPC ... H01L 23/367; H01L 25/0655; H01L 24/32; H01L 23/34; H01L 23/42; H01L 23/053; H01L 23/3675; H01L 23/24; H01L 2924/13055; H01L 2924/0002
USPC .................................. 257/707, 713, 675, 706
See application file for complete search history.

(56) References Cited

U.S. PATENT DOCUMENTS

| | | | | |
|---|---|---|---|---|
| 5,703,399 A | * | 12/1997 | Majumdar | ............ H01L 21/565 257/675 |
| 2009/0002956 A1 | * | 1/2009 | Suwa | ...................... B60L 1/003 361/728 |

(Continued)

FOREIGN PATENT DOCUMENTS

| | | |
|---|---|---|
| JP | 9-298889 | 11/1997 |
| JP | 2011-103445 | 5/2011 |

OTHER PUBLICATIONS

U.S. Appl. No. 14/306,536, filed Jun. 17, 2014, Seiji Morino.

*Primary Examiner* — Shouxiang Hu
(74) *Attorney, Agent, or Firm* — Nixon & Vanderhye P.C.

(57) ABSTRACT

In an electronic control device, semiconductor modules are disposed in a power region of a substrate, and on a surface of a substrate adjacent to a housing to radiate heat from rear surfaces to the housing through a heat radiation layer. Therefore, a heat radiation performance improves. Further, a first distance from an end surface of a power region corresponding part corresponding to the power region to the substrate is shorter than a second distance from an end surface of a control region corresponding part corresponding to a control region of the substrate to the substrate. Therefore, a closed circuit bridged by parasitic capacitances is formed mainly in an area of the power region and the power region corresponding part. A noise generated from the semiconductor modules is returned to noise sources through the closed circuit without affecting the control region.

7 Claims, 7 Drawing Sheets

(56) References Cited

U.S. PATENT DOCUMENTS

2009/0322149 A1* 12/2009 Kishibata ............... H05K 1/148 307/10.1

2012/0038033 A1* 2/2012 Oga ...................... H01L 21/565 257/659

* cited by examiner

ELECTRONIC CONTROL DEVICE

CROSS REFERENCE TO RELATED APPLICATION

This application is based on Japanese Patent Application No. 2013-269339 filed on Dec. 26, 2013, the disclosure of which is incorporated herein by reference.

TECHNICAL FIELD

The present disclosure relates to an electronic control device having a substrate on which electronic components are disposed, and a housing.

BACKGROUND ART

In an electronic control device having a substrate and a housing, it has been conventionally known to divide a region of the substrate into a power region in which power-system components such as an electric field effect transistor are disposed and a control region in which control-system components such as a microcomputer are disposed on a plane of the substrate. Such an electronic control device is, for example, disclosed in JP 2011-103445 A.

SUMMARY

In an electronic control device of JP 2011-103445 A, both of power-system electronic components and control-system electronic components are mounted on one surface of a substrate. In this structure, a noise caused by a switching operation of an electric field effect transistor passes through a closed circuit formed by the substrate and a housing in an area also including a control region, and may affect the control-system electronic components.

In a case where an electronic control device is employed to a driving device that drives a motor generating a relatively large output, for example, the amount of heat generated from an electric field effect transistor is large. Therefore, it is necessary to effectively radiate the heat to the housing. However, there is a possibility that heat radiation only from a lead terminal of the electric field effect transistor to the housing through the substrate is insufficient.

The present disclosure is made in view of the foregoing issue, and it is an object of the present disclosure to provide an electronic control device having power-system electronic components and a control-system electronic component on a plane of a substrate, and which is capable of reducing an influence of noise on the control-system electronic component and improving a heat radiation performance.

According to a first aspect of the present disclosure, an electronic control device includes a substrate and a housing. The substrate includes a power region in which power-system electronic components are disposed and a control region in which a control-system electronic component is disposed, and the power region and the control region are divided from each other on one plane. The power-system electronic components include a plurality of semiconductor modules in each of which a chip of a semiconductor element is packaged. The control-system electronic component controls electric conduction to the plurality of semiconductor modules.

The plurality of semiconductor modules is surface-mounted on a rear mounting surface of the substrate, which is adjacent to the housing. Thus, heat can be radiated to the housing from a rear surface of the semiconductor modules opposed to the housing through an electrically insulating and thermally conductive heat radiation layer. The heat radiation layer may be provided by a heat radiation gel or a heat radiation sheet, for example.

In the housing, "a first distance from an end surface of a power region corresponding part, which corresponds to the power region of the substrate, to the substrate" is shorter than "a second distance from an end surface of a control region corresponding part, which corresponds to the control region of the substrate, to the substrate".

The "semiconductor module" is a module in which a chip of a semiconductor switching element such as MOSFET or a semiconductor element other than the switching element is packaged. The semiconductor module used in a power circuit through which a large amount of current flows, typically, generates heat when being electrically conducted.

In the above structure, the semiconductor modules are mounted on the surface of the substrate adjacent to the housing, which is also referred to as the "rear mounting surface" of the substrate, and heat can be radiated from the rear surface of the semiconductor modules to the housing through the heat radiation layer. Therefore, as compared to a structure in which heat is radiated only from the lead terminal to the substrate, a heat radiation performance improves.

In a case where the electronic components are separately arranged on both surfaces of the substrate, the electronic control device is reduced in size while effectively using the space of the substrate.

When the plurality of semiconductor modules disposed between the substrate and the housing is electrically conducted, parasitic capacitances are generated between the semiconductor modules and the housing that is on a ground level. In this case, the first distance between the power region of the substrate and the power region corresponding part of the housing is shorter than the second distance between the control region of the substrate and the control region corresponding part of the housing. Therefore, a "closed circuit bridged through the plurality of parasitic capacitances" is formed mainly in an area of the power region and the power region corresponding part. As a result, a noise generated from the semiconductor modules of the power region is returned to noise sources through the closed circuit without affecting the control region. Therefore, the influence of noise on the control-system electronic component can be reduced.

According to a second aspect of the present disclosure, the power region corresponding part is formed with a recessed portion that is recessed from the end surface of the power region corresponding part and receives the semiconductor modules therein.

In a case where the heat radiation layer is provided by the heat radiation gel, since the heat radiation gel is filled in the recessed portion, it is less likely that the heat radiation gel will flow out from the recessed portion. Further, since the end surface of the power region corresponding part can be made higher than the rear surface of the semiconductor module, it is effective to make the first distance short.

According to a third aspect of the present disclosure, the end surface of the power region corresponding part is at the same height as the end surfaces of the support parts.

In this case, the first distance is zero, and the path of the closed circuit can be the shortest. Therefore, the influence of noise on the control-system electronic component can be reduced minimum. Since the first distance is zero, the contact area between the substrate and the housing increases. Therefore, the heat radiation performance from the substrate to the housing improves.

According to a fourth aspect of the present disclosure, the housing has a plural number of the support parts in the power region corresponding part.

In such a case, the curve or deformation of the substrate due to heat can be restricted. Therefore, an occurrence of an insulation failure due to the rear surface of the semiconductor module contacting the housing can be reduced.

According to a fifth aspect of the present disclosure, the substrate and the housing have the same outer size in a plan view.

In such a case, the electronic control device is reduced in size as small as possible while effectively using the space.

According to a sixth aspect of the present disclosure, the chip of the semiconductor module is a semiconductor switching element. The semiconductor switching element is, for example, employed to an H-bridge circuit that drives a DC brush motor or an inverter circuit that drives a three-phase alternating current brushless motor. Alternatively, the semiconductor switching element may be employed as a power supply relay disposed on a power supply side of the H-bridge circuit or the inverter circuit or a motor relay disposed between the H-bridge circuit or the inverter circuit and the motor.

In the semiconductor switching element used in the H-bridge circuit or in the inverter circuit, particularly, the noise or the amount of heat generated when the semiconductor switching element is electrically conducted is relatively large, may easily cause a problem. Therefore, the effects of the reduction of influence of noise and the improvement of the heat radiation performance are effectively exhibited.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Figure 1A:
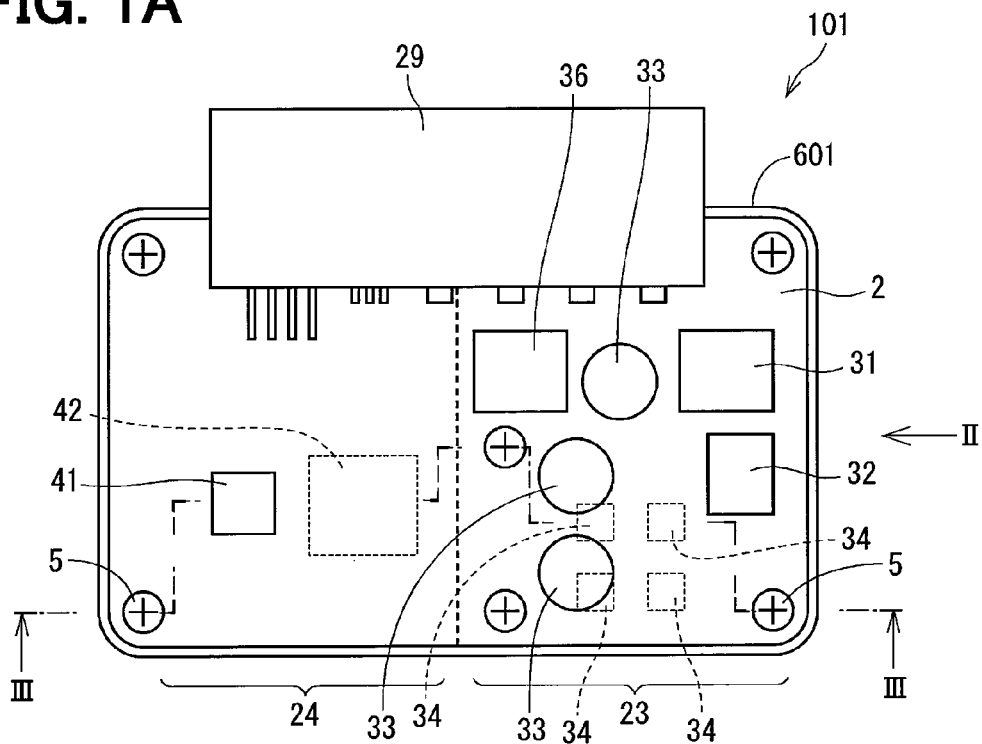
FIG. 1A is a schematic plan view of an electronic control device according to a first embodiment of the present disclosure.

Hereinafter, electronic control devices according to embodiments of the present disclosure will be described with reference to the drawings.

First Embodiment

An electronic control device of a first embodiment of the present disclosure will be described with reference to FIGS. 1 to 6. The electronic control device is, for example, used as a driving device that drives a motor generating a steering assist torque in a vehicular electric power steering apparatus.

As shown in FIGS. 1 to 4, an electronic control device 101 includes a substrate 2 on which various electronic components are disposed and a housing 601 to which the substrate 2 is fixed.

The substrate 2 is made of an electrically insulating material such as a glass epoxy or ceramic. Power-system electronic components and control-system electronic components are mounted on a front mounting surface 21, which is a front surface viewed in FIG. 1A, and on a rear mounting surface 22, which is a surface adjacent to the housing 601. A power region 23 of the substrate 2 in which the power-system electronic components are disposed is located on a right side in FIG. 1A, and a control region 24 of the substrate 2 in which the control-system electronic components are disposed is located on a left side in FIG. 1A. In the substrate 2, as a premise, the power region 23 and the control region 24 are divided from each other on a plane.

On the contrary, examples of the form of the substrate that do not constitute the "substrate" of the present disclosure are: a form in which a substrate having the power-system electronic components disposed thereon and a substrate having the control-system electronic components disposed thereon are fixed to separate housings; a form in which a substrate having the power-system electronic components disposed thereon and a substrate having the control-system electronic components disposed thereon are stacked in layers; and a form in which the power-system electronic components and the control-system electronic components are arranged disorderly on a substrate without being divided into separate regions. It is considered that electronic control devices having the substrates with these forms do not have the problem of the present disclosure or cannot solve the problem by means of the present disclosure.

The power-system electronic components disposed in the power region 23 include a power supply relay 31, a coil 32, electrolyte capacitors 33, a motor relay 36, semiconductor modules 34, and the like. Among these components, electronic components having a relatively large size other than the semiconductor modules 34 are mounted on the front mounting surface 21, and the semiconductor modules 34 are mounted on the rear mounting surface 22. The power supply relay 31 and the motor relay 36 of the first embodiment are mechanical electromagnetic switching relays.

The "semiconductor module" generally means a package in which a chip of a semiconductor element is molded in a resin to be suitably mounted on a substrate, and is for example a component having a rectangular parallelepiped-shape. In the present embodiment, the chip of the semiconductor element is a semiconductor switching element. In particular, the semiconductor switching element is assumed to be a MOSFET (metal oxide semiconductor field effect transistor).

On the other hand, as the control-system electronic components, a microcomputer 41 and a custom IC 42 are disposed in the control region 24.

The substrate 2 is provided with a connector 29 to which harnesses or the like are connected for inputting and outputting electric power and control signals between external devices and the power-system electronic components and the control-system electronic components. In an actual product, other electronic components such as a shunt resistor for detecting a current flowing in the semiconductor module 34 may also be included. However, such electronic components are omitted in this description.

As shown in FIG. 1A, the substrate 2 and the housing 601 have the same outer size, when viewed in a direction perpendicular to a planar direction of the substrate 2.

Figure 5:
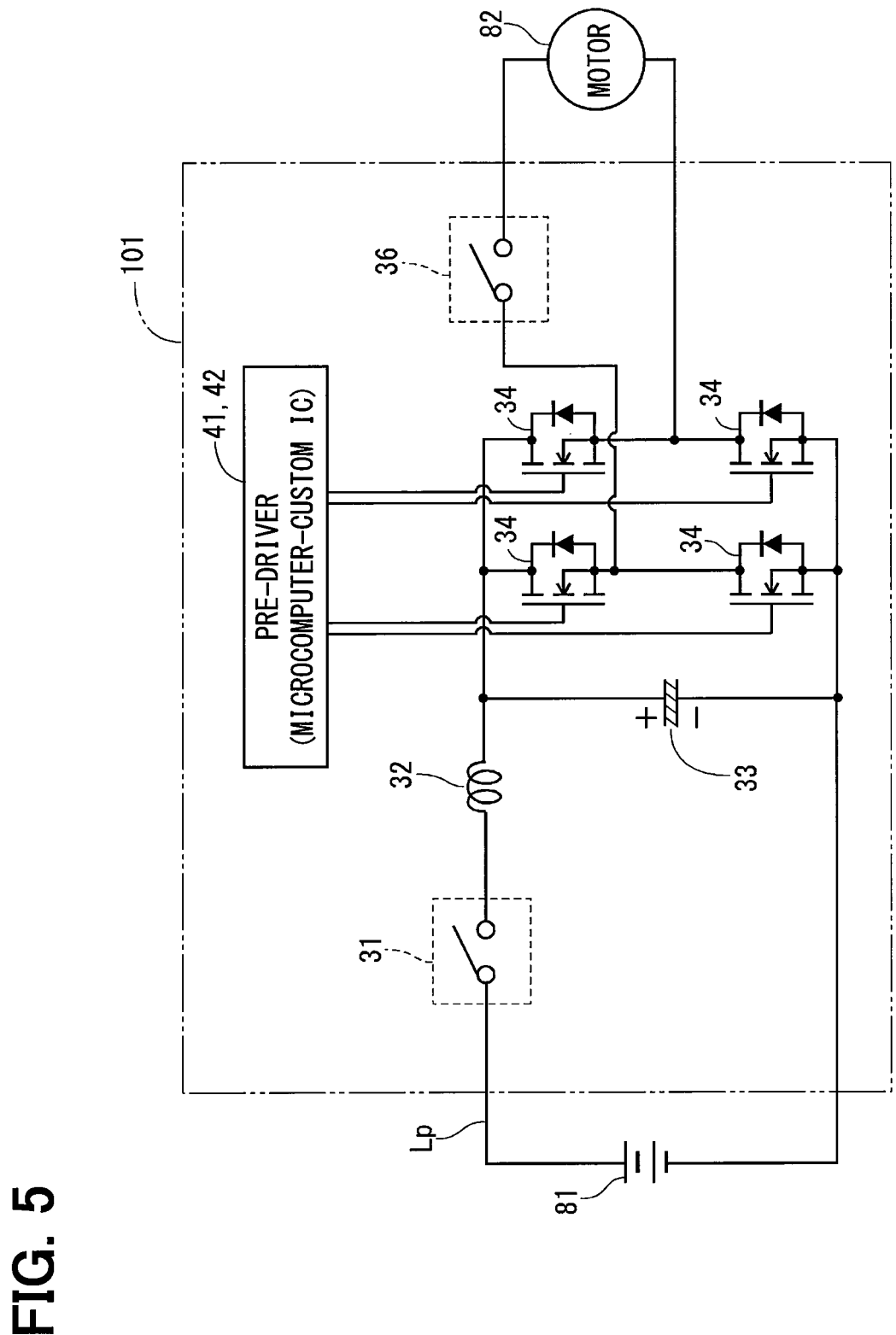
FIG. 5 is a schematic circuit diagram of the electronic control device according to the first embodiment.

Functions of the electronic components will be described with reference to a schematic circuit diagram of FIG. 5.

The electronic control device 101 is a driving device of a DC brush motor that generates a steering assist torque in an electric power steering apparatus. The electronic control device 101 converts a DC power of a battery 81 into a desired power in an H-bridge circuit and outputs the power to a motor 82, according to a required output torque of the motor 82.

The power supply relay 31 is disposed on a power supply line Lp on an input side of the H-bridge circuit. The power supply relay 31 shuts off an electric power supply from the battery 81 to the H-bridge circuit when an ignition is turned off or when an abnormality is detected.

The coil 32 and the electrolyte capacitor 33 smooth an input voltage by reducing pulsation of the input voltage. As shown in FIG. 1A, a plurality of the electrolyte capacitors 33 (e.g., three electrolyte capacitors) may be connected in parallel on the substrate 2.

Four semiconductor modules 34 constitute the H-bridge circuit. A unit of two semiconductor modules 34 connected in series to each other, between the power supply line and a ground line, is referred to as a "leg". The two semiconductor modules 34 of each leg are switched, except for a dead time, so that one of the semiconductor modules 34 is turned on (turns on an electric path between a source and a drain) when the other of the semiconductor modules 34 is turned off, and a voltage at an intermediate point is outputted to the motor 82.

The motor relay 36 shuts off an electric path between the H-bridge circuit and the motor 82 when it is necessary to restrict an electromotive force generated in the motor 82 from being inputted into the H-bridge circuit.

The microcomputer 41 and the custom IC 42, as the control-system electronic components, calculate a voltage command to the H-bridge circuit based on a required output torque and a feedback current of the motor 82. Further, as a pre-driver of the semiconductor modules 34, the microcomputer 41 and the custom IC 42 output a switching signal to a gate terminal of each MOSFET based on the voltage command.

In the present embodiment, the electronic components described above are mainly disposed on the substrate 2.

Next, the housing 601 will be described. The housing 601 is made of aluminum. The housing 601 has a function of supporting the substrate 2; a function of a "heat sink" receiving heat generated from the electronic components disposed on the substrate 2, particularly, the power-system electronic components including the semiconductor modules 34, when the electronic components are electrically conducted; a function of generating parasitic capacitances between the housing 601 and the semiconductor modules 34 due to the housing 601 being insulated from the semiconductor modules 34 and being on a ground level, as will be described later; and the like.

Figure 1B:
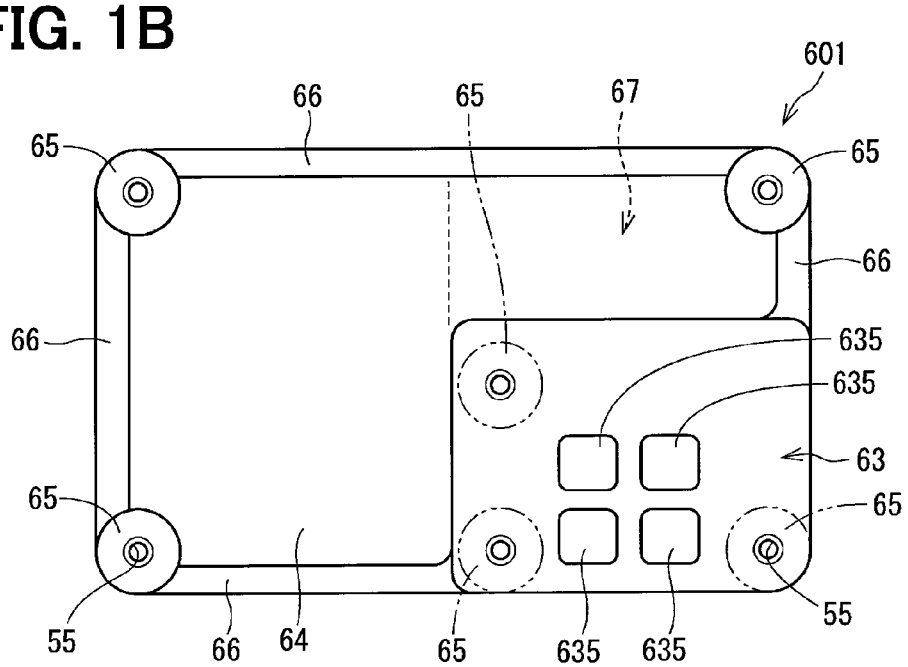
FIG. 1B is a schematic plan view of a housing of the electronic control device.
Figure 2:
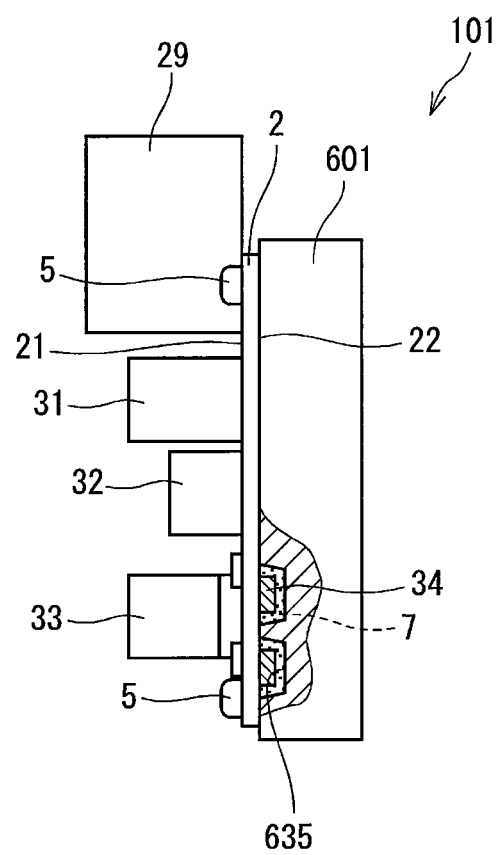
FIG. 2 is a side view of the electronic control device, partially including a cross-section, when viewed along an arrow II in FIG. 1A.
Figure 3:
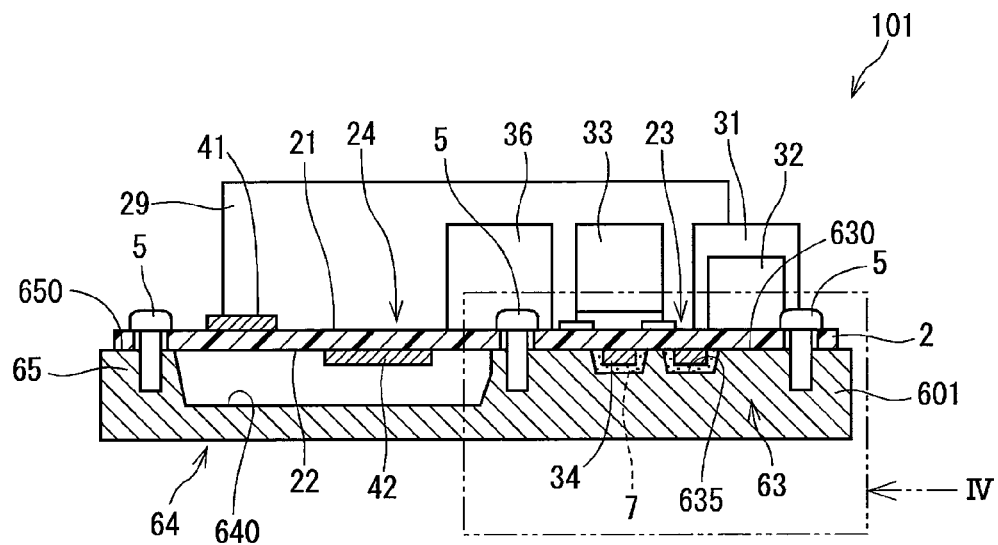
FIG. 3 is a cross-sectional view taken along a line III-III in FIG. 1A.

As shown mainly in FIGS. 1B and 3, the housing 601 has a rectangular plate shape in a plan view. The housing 601 has a power region corresponding part 63 corresponding to the power region 23 of the substrate 2, a control region corresponding part 64 corresponding to the control region 24 of the substrate 2, support parts 65 supporting the substrate 2 when the substrate 2 is fixed thereon by screws, and the like. The support parts 65 are provided at four corner portions of the housing 601 and at portions of the power region corresponding part 63, the portions being adjacent to a boundary between the power region corresponding part 63 and the control region corresponding part 64 in the power region corresponding part 63.

A frame portion 66 is formed along the outer edge of the housing 601 and between the support parts 65. The frame portion 66 has a height slightly lower than that of the support parts 65, so that a clearance is defined between the frame portion 66 and the substrate 2. The clearance is used for draining a water droplet or the like.

Including the other embodiments described later, the plurality of support parts 65 is formed such that end surfaces 650 thereof are at the same height and provide the maximum height of the housing 601. The control region corresponding part 64 has a recessed shape. An end surface 640 of the control region corresponding part 64 is lower than the end surfaces 650 of the support parts 65. An end surface 630 of the power region corresponding part 63 is higher than the end surface 640 of the control region corresponding part 64, and is at a height equal to or lower than the end surfaces 650 of the support parts 65.

Figure 4:
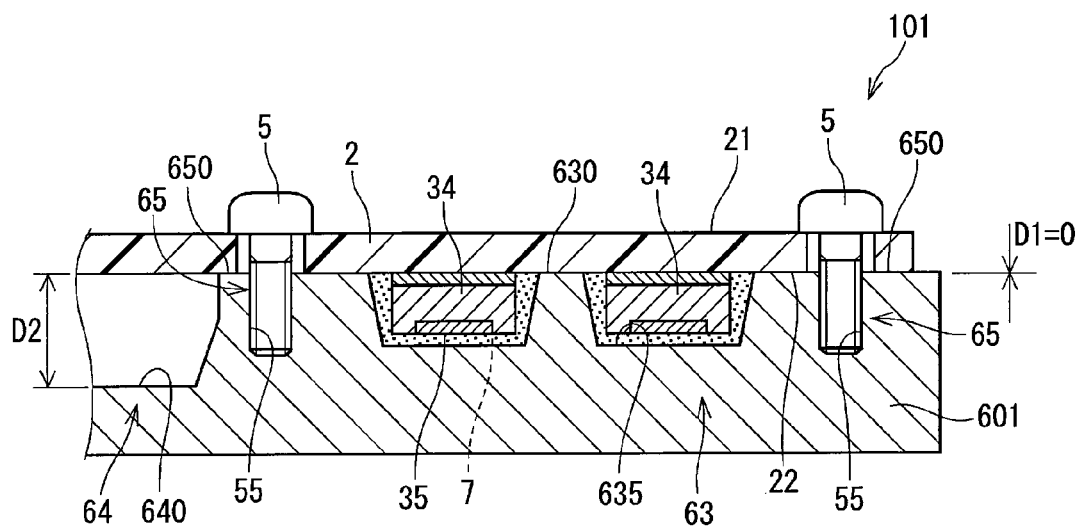
FIG. 4 is an enlarged view of a part IV in FIG. 3.

In the first embodiment, particularly, the end surface 630 of the power region corresponding part 63 is at the same height as the end surfaces 650 of the support parts 65. Specifically, as shown in FIG. 4, a "first distance D1 that is a distance from the end surface 630 of the power region corresponding part 63 to the substrate 2" is zero. On the other hand, in the control region corresponding part 64 that is formed into the recessed shape, a "second distance D2 that is a distance from the end surface 640 of the control region corresponding part 64 to the substrate 2" has a positive value. As such, a relationship of "the first distance D1 is shorter than the second distance D2" is established. The first distance D1 and the second distance D2 are measured in a direction perpendicular to a planar direction of the substrate 2.

Since the end surface 630 of the power region corresponding part 63 and the end surfaces 650 of the support parts 65 are at the same height, a boundary between the power region corresponding part 63 and the support part 65 is not indicated with a solid line in FIG. 1B. Instead, the support part 65 is illustrated with an imaginary line (double-dashed chain line).

The support parts 65 located outside of an area of the power region corresponding part 63 have a pillar shape. Each of the support parts 65 is formed with a female threaded portion 55 into which a screw 5 is screwed. When the screws 5 are screwed with the female threaded portions 55 through screw holes of the substrate 2, the substrate 2 is fixed to the housing 601. In the present embodiment, three support parts 65 are provided in an area of the power region corresponding part 64. Therefore, the substrate 2 can be fixed at a relatively short pitch. As such, the curve or deformation of the substrate 2 due to heat can be restricted.

In addition, a recessed portion 67 located on an upper side of the power region corresponding part 63 in FIG. 1B is not included in the power region corresponding part 63. The recessed portion 67 is only a part that is located directly under a "portion that is spaced from the substrate 2 outside of the lead terminals" of the connector 29, the power supply relay 31, the electrolyte capacitor 33 and the motor relay 36. That is, the definition of the power region corresponding part 63, that is, "corresponding to the power-system electronic components" can be rephrased as "corresponding to all of the semiconductor modules 34 and portions of at least the lead terminals of the other power-system electronic components", exactly.

The power region corresponding part 63 is provided with recessed portions 635. The recessed portions 635 are recessed from the end surface 630 and receive the semiconductor modules 34 therein. In the example of the first embodiment, four recessed portions 635 are formed corresponding to the number of the semiconductor modules 34.

FIG. 4 is not an exact enlarged view of a part IV of FIG. 3. In FIG. 4, the recessed portions 635 are illustrated with enlarged size to emphasize. As shown in FIG. 4, each of the semiconductor modules 34 is surface-mounted on the rear mounting surface 22 of the substrate 2 such that a lead part corresponding to the source terminal and the drain terminal faces the rear mounting surface 22. A rear surface 35 of the semiconductor module 34, which is an exposed surface from which a source electrode is exposed, is opposed to the housing 601. The recessed portion 635 has a depth so that the rear surface 35 of the semiconductor module 34 does not contact the bottom surface of the recessed portion 635 and a small clearance is provided between the rear surface 35 and the bottom surface of the recessed portion 635.

A heat radiation gel 7 is filled in between the rear surface 35 of the semiconductor module 34 and the bottom surface of the recessed portion 635. The heat radiation gel 7 is, for example, made of an electrically insulating and thermally conductive silicon-based material. Therefore, the heat generated from the semiconductor module 34, when the semiconductor module 34 is electrically conducted, can be radiated from the rear surface 35 to the housing 601 through the heat radiation gel 7. The recessed portions 635 provide an example of a heat radiation part of the housing 601.

The motor 82, which generates the steering assist torque in the electric power steering apparatus, needs to rapidly generate a large output. Therefore, a large amount of current flows in the MOSFET, and heat is generated. Further, due to a limitation of a mounting space in a vehicle, the electronic control device 101 is necessarily reduced in size. Therefore, it is in a severe environment where sufficient heat radiation is hard to be carried out. If the MOSFET is overheated over an allowable temperature, there is a possibility that the element is broken, resulting in a failure of a function of assisting a steering operation.

Therefore, when a "rear heat radiation structure" described above is employed, a part of the heat of the semiconductor module 34 is radiated to the substrate 2 from the lead part, and another part of the heat is radiated to the housing 601 from the rear surface 35 through the heat radiation gel. Therefore, even if the amount of heat generated from the MOSFET is large and the heat radiation only to the substrate 2 is insufficient, the radiation of heat of the semiconductor module 34 can be improved by the heat radiation from the rear surface 35.

Further, the recessed portion 635 is formed on a periphery of the semiconductor module 34. Therefore, the heat radiation gel 7 hardly flows out.

In addition, since the semiconductor module 34 that projects relative to the rear mounting surface 22 is received in the recessed portion 635, the end surface 630 of the power region corresponding part 63 can be set higher than the height of the rear surface 35 of the semiconductor module 34. That is, the structure where "the first distance D1 is zero" is established on condition that the recessed portion 635 is formed and the semiconductor module 34 is received in the recessed portion 635.

Figure 6:
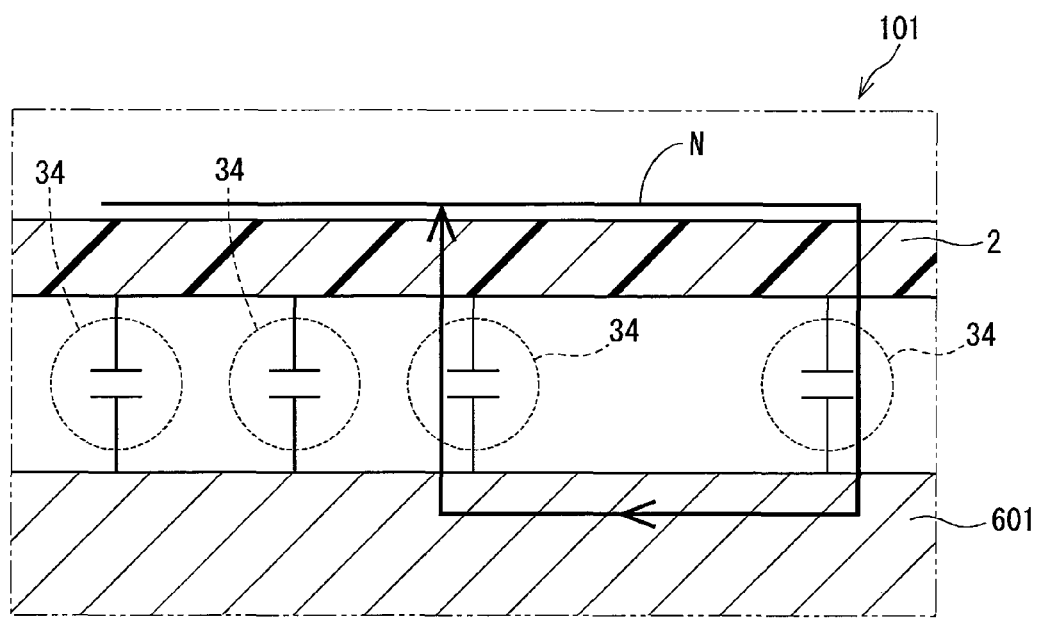
FIG. 6 is a diagram for explaining a closed circuit through which a noise generated in the substrate passes.

Next, an effect of "reduction in influence of noise on the control-system electronic components" will be described with reference to FIG. 6.

In the H-bridge circuit, since the plurality of semiconductor modules 34 performs the switching operations frequently, a noise is generated. There is a possibility that the noise causes an arithmetic error or an erroneous determination of the microcomputer 41 or the custom IC 42.

In the present embodiment, the plural semiconductor modules 34, which are typically the source of noise, are disposed on the rear mounting surface 22 of the substrate 2. Since the housing 601 is electrically insulated from the semiconductor modules 34 and is on the ground level, when the semiconductor module 34 is electrically conducted, a "parasitic capacitance" is generated between the semiconductor module 34 and the housing 601. As shown in FIG. 6, this parasitic capacitance can be considered as a pseudo-capacitor, as shown in FIG. 6. Further, when a plurality of the parasitic capacitances bridges between the substrate 2 and the housing 601, a closed circuit is formed. The noise N generated from the semiconductor modules 34 on the substrate 2 returns to the semiconductor modules 34, which are the noise source, through this closed circuit, as shown a solid arrow.

In FIG. 4, the first distance D1 is shorter than the second distance D2, and the substrate 2 and the housing 601 are separated from each other in the control region corresponding part 64. Therefore, even if the parasitic capacitance is generated, the size of the parasitic capacitance is extremely smaller than that of the power region corresponding part 63. As such, the closed circuit is mainly formed in an area of the power region 23 and the power region corresponding part 63, and does not reach the control region 24. Accordingly, the influence of noise on the control-system electronic components can be reduced.

The effects of the electronic control device 101 of the first embodiment are summarized as follows.

(1) The semiconductor module 34 is surface-mounted on the rear mounting surface 22 of the substrate 2 adjacent to the housing 601, and the heat can be radiated from the rear surface 35 to the housing 601 through the heat radiation gel 7. Therefore, as compared with the conventional structure in which the heat is radiated only to the substrate 2 from the lead terminals, the heat radiation can be improved.

The electronic components are separately arranged on both of the surfaces of the substrate 2. Therefore, the electronic control device 101 can be reduced in size while effectively using the space of the substrate 2.

As such, the electronic control device 101 is effectively employed to the device in which the amount of heat generated from the semiconductor modules 34 is relatively large and the size reduction is required, as the driving device that drives the steering assist motor of the electric power steering apparatus.

(2) When the semiconductor modules 34 are electrically conducted, the plural parasitic capacitances are generated between the plural semiconductor modules 34 and the housing 601, which is on the ground level, and the closed circuit through which the noise passes is formed. Further, the first distance D1 from the end surface 630 of the power region corresponding part 63 to the substrate 2 is shorter than the second distance D2 from the end surface 640 of the control region corresponding part 64 to the substrate 2. Therefore, the "closed circuit bridged by the plural parasitic capacitances" is mainly formed in the area of the power region 23 and the power region corresponding part 63. As a result, the noise generated from the semiconductor modules 34 of the power region 23 is returned to the sources through the closed circuit without affecting the control region 24. As such, the influence of noise on the control-system electronic components can be reduced.

(3) The power region corresponding part 63 is provided with the recessed portions 635 that are recessed from the end surface 630 and receive the semiconductor modules 34 therein. Therefore, it is less likely that the heat radiation gel 7 filled in the recessed portions 635 will flow out. Further, the end surface 630 of the power region corresponding part 63 can be made higher than the rear surface 35 of the semiconductor module 34. Therefore, it is effective to make the first distance D1 small. The path of the closed circuit is shortened with the decrease in the first distance D1. Therefore, the influence of noise on the control-system electronic components can be further reduced.

(4) In the present embodiment, particularly, the first distance D1 is zero, and the path of the closed circuit is recued to the minimum. Therefore, the influence of noise on the control-system electronic components can be largely reduced. Further, since the first distance D1 is zero, the contact area between the substrate 2 and the housing 601 increases. Therefore, the heat radiation from the substrate 2 to the housing 601 can be improved.

(5) Since the plural support parts 65 are provided in the area of the power region corresponding part 63, the curve or deformation of the substrate 2 due to heat can be restricted. Therefore, it is possible to restrict an occurrence of an insulation failure due to the rear surface 35 of the semiconductor module 34 being in contact with the housing 601.

(6) The substrate 2 and the housing 601 have the same outer size in the plan view. Therefore, the size of the electronic control device 101 can be made as small as possible while effectively using the space.

Modification of the First Embodiment

The electronic control device 101 of the first embodiment includes the H-bridge circuit made of the four semiconductor modules 34, and is employed as the driving device that drives the DC brush motor. As a modification of the first embodiment, the electronic control device 101 is configured to have an inverter circuit made of six semiconductor modules 34 to be employed as a driving device for driving a three-phase alternating current brushless motor. Namely, the H-bridge circuit made of the four semiconductor modules 34 can be replaced with the inverter circuit made of the six semiconductor modules 34. In such a case, the six semiconductor modules 34 are arranged in the similar manner to the first embodiment shown in FIGS. 1 to 4.

Also in such a modification, in the power region corresponding part 63 corresponding to the power region 23 in which the six semiconductor modules 34 are mounted, the housing 601 is formed such that the first distance D1 is shorter than the second distance D2. In such a case, the effects similar to the first embodiment can be achieved.

Next, a second embodiment and a third embodiment will be described with reference to FIG. 7 and FIG. 8, which correspond to FIG. 4 of the first embodiment. The second embodiment and the third embodiment are variations in the position of the end surface 630 of the power region corresponding part 63 in the electronic control device of the present disclosure. In the second and third embodiments, the structures other than the power region corresponding part 63 are similar to those of the first embodiment. In the following descriptions, therefore, components substantially the same as those of the first embodiment are designated with the same reference numbers, and descriptions thereof will be omitted.

Second Embodiment

Figure 7:
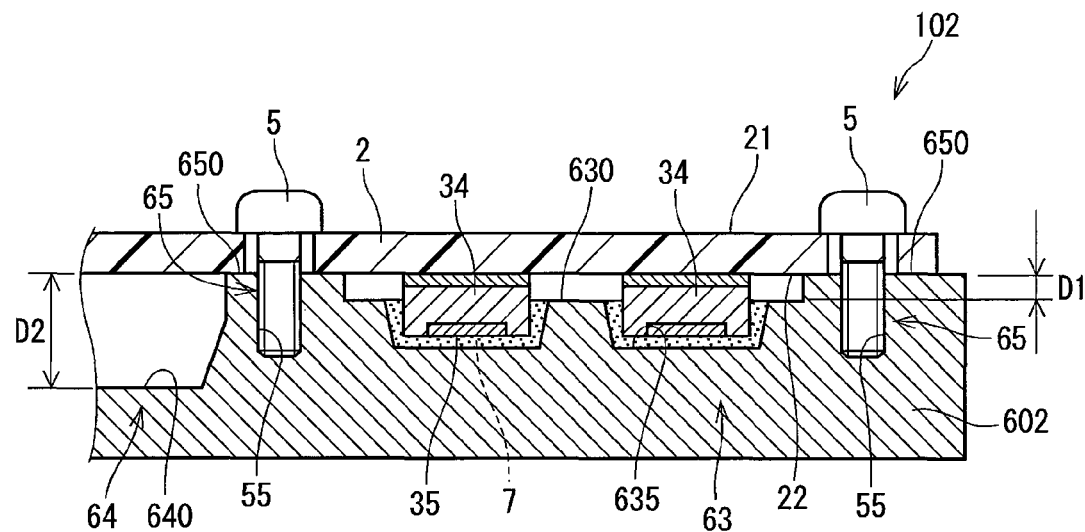
FIG. 7 is a cross-sectional view of an electronic control device according to a second embodiment of the present disclosure.

In an electronic control device 102 of the second embodiment shown in FIG. 7, similarly to the first embodiment, a housing 602 is provided with the recessed portions 635 in the power region corresponding part 63 to receive the semiconductor modules 34 therein. However, the end surface 630 of the power region corresponding part 63 is at a height lower than the end surfaces 650 of the support parts 65 by one step. Therefore, the first distance D1 from the end surface 630 of the power region corresponding part 63 to the substrate 2 is not zero, but is a value smaller than the second distance D2 of the control region corresponding part 64.

The second embodiment achieves the similar effects to the effects (1), (2), (3), (5) and (6) of the first embodiment, except for the effect (4).

Third Embodiment

Figure 8:
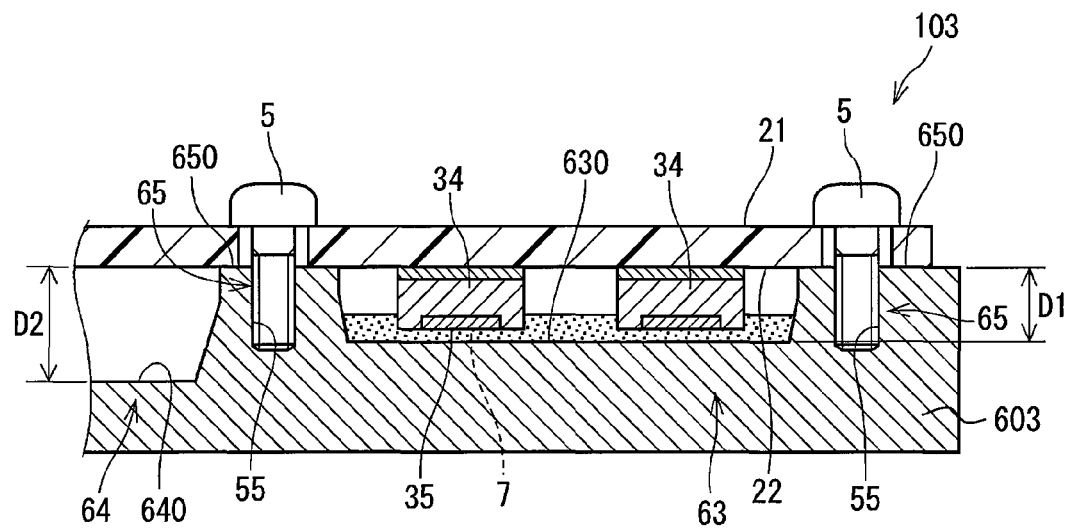
FIG. 8 is a cross-sectional view of an electronic control device according to a third embodiment of the present disclosure.

In an electronic control device 103 of the third embodiment shown in FIG. 8, differently from the first and second embodiments, a housing 603 is not provided with the recessed portions 635 in the power region corresponding part 63. Further, the end surface 630 is formed at the level corresponding to the bottom surface of the recessed portions 635 of the first and second embodiments, evenly over the entire area of the power region corresponding part 63. Also in the third embodiment, the first distance D1 from the end surface 630 of the power region corresponding part 63 to the substrate 2 is shorter than the second distance D2 of the control region corresponding part 64.

The third embodiment achieves the similar effects to the effects (1), (2), (5) and (6) of the first embodiment, except for the effects (3) and (4).

Fourth Embodiment

Figure 9:
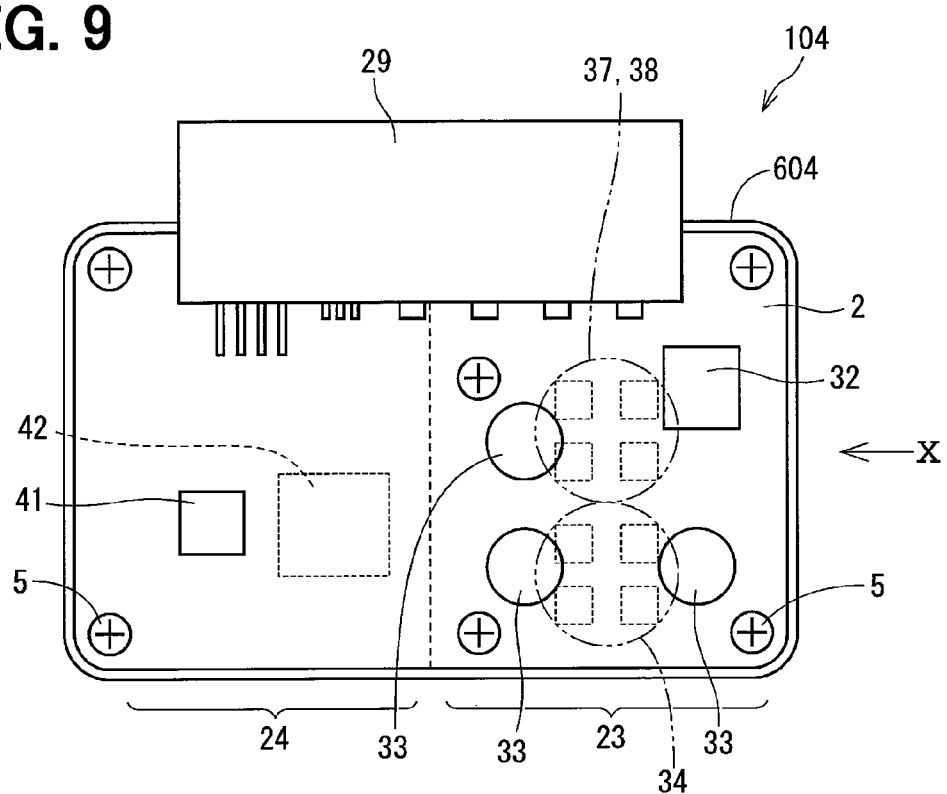
FIG. 9 is a schematic plan view of an electronic control device according to a fourth embodiment of the present disclosure.
Figure 10:
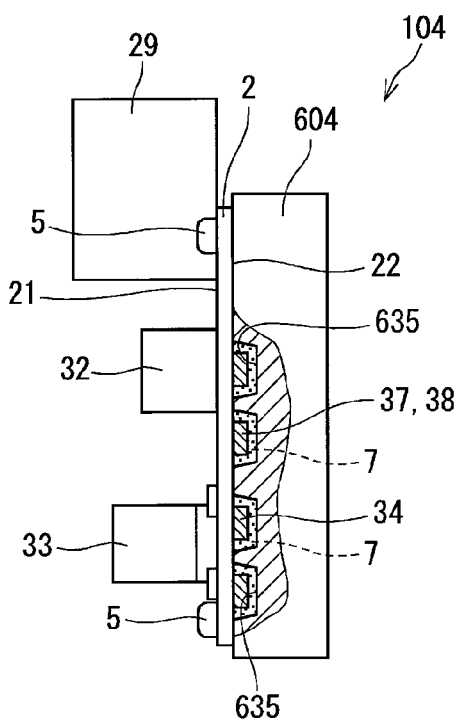
FIG. 10 is a side view of the electronic control device, partially including a cross-section, when viewed along an arrow X in FIG. 9.

Next, a fourth embodiment of the present disclosure will be described with reference to FIGS. 9 and 10. In the fourth embodiment, differently from the first embodiment, the power supply relay and the motor relay as the power-system electronic components are made of semiconductor relays, in place of the mechanical relays. The other structures of the fourth embodiment are similar to those of the first embodiment. FIG. 9 and FIG. 10, respectively, correspond to FIG. 1A and FIG. 2 of the first embodiment. The figure corresponding to FIG. 3 of the first embodiment can be easily realized by eliminating the illustrations of the power supply relay 31 and the motor relay 36 from FIG. 3, and is thus omitted.

As shown in FIGS. 9 and 10, in an electronic control device 104 of the fourth embodiment, the power supply relay 31 and the motor relay 36, which are the mechanical relays, are not mounted on the front mounting surface 21 of the substrate 2. Instead, a semiconductor power source relay 37 and a semiconductor motor relay 38, which are, for example, made of MOSFETs, are surface-mounted on the rear mounting surface 22 in the form of the semiconductor modules similar to the four semiconductor modules 34 constituting the H-bridge circuit. For example, the electronic control device 104 has eight semiconductor modules 34, 37 and 38, in total, including the two semiconductor power supply relays 37 and the two semiconductor motor relays 38.

The two semiconductor power supply relays 37 are connected in series on the power supply line between the battery and the H-bridge circuit, such that directions of freewheel diodes thereof are opposite to each other. Therefore, even if the electrodes of the battery are connected in any directions, the current supply from the battery to the H-bridge circuit can be shut off.

The two semiconductor motor relays 38 are disposed between the intermediate point of one of legs of the H-bridge circuit and the motor to shut off a power supply between the H-bridge circuit and the motor.

In FIG. 10, the four semiconductor modules 34, 37, 38 received in the recessed portions 635 appear in a cross-section taken in a short-side direction of the housing 604. The structure of each of these components is substantially the same as that shown in FIG. 2.

Similarly to the first embodiment, a person skilled in the art can easily arrive to make the electronic control device as a driving device for a three-phase alternating current brushless motor by replacing the H-bridge circuit with an inverter circuit. In a case where the H-bridge circuit is replaced with the three-phase inverter circuit, the number of the semiconductor modules 34 forming the inverter circuit is six, and the number of the semiconductor motor relays 38 is three.

As described above, in the electronic control device 104 of the fourth embodiment, the number of the semiconductor modules is greater than the number of the semiconductor modules of the first embodiment. However, the frequency of switching operations of the semiconductor power supply relays 37 and the semiconductor motor relays 38 is low. Therefore, the occurrence of noise and the amount of heat generated are much less than those of the semiconductor modules 34 constituting the H-bridge circuit. In regard to the noise, the number of the parasitic capacitors increases with an increase in the number of the noise sources. Therefore, the noises generated from the larger number of the noise sources are returned to the noise sources through the larger number of the parasitic capacitors. As such, the number of the noise sources does not affect the effect of the noise reduction.

Namely, the fourth embodiment achieves the similar effects to those of the first embodiment.

Other Embodiments (a) In the electronic control device of the present disclosure, the specific shapes of the substrate and the housing, the arrangement between the power region and the control region, and the like are not limited to the structures of the embodiments described above. Any substrate in which the power region and the control region are divided on the same plane can satisfy the "substrate" of the present disclosure, irrespective of the shape and the arrangement of each region. Further, the number of the substrate is not limited to one. For example, a substrate for the power region and a substrate for the control region may be separately arranged at the same height.

(b) As a "heat radiation layer" of the present disclosure, an electrically insulating heat radiation sheet may be used, in place of the heat radiation gel of the embodiments described above.

(c) The chip of the semiconductor element in the "semiconductor module" of the present disclosure includes semiconductor switching elements such as an IGBT, or a thyristor, and any other semiconductor elements, other than the MOSFET.

(d) The electronic control device of the present disclosure is not limited to the device for driving the steering assist motor of the electric power steering apparatus, but may be employed to various driving devices forming the H-bridge circuit or the inverter circuit, and any other devices having semiconductor elements used for other purposes.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:
1. An electronic control device comprising:
a substrate having a power region in which a plurality of power-system electronic components are disposed and a control region in which a control-system electronic component is disposed, the power region and the control region being divided from each other on a plane, the power-system electronic components including a plurality of semiconductor modules in each of which a chip of a semiconductor element is packaged, the control-system electronic component controlling electric conduction of the plurality of semiconductor modules; and
a housing having a plurality of support parts supporting the substrate, wherein
the plurality of semiconductor modules are mounted on a surface of the substrate adjacent to the housing, and are disposed to radiate heat from rear surfaces of the semiconductor modules, which are opposed to the housing, to the housing through an electrically insulating and thermally conductive heat radiation layer,
the housing has a power region corresponding part corresponding to the power region of the substrate and a control region corresponding part corresponding to the control region of the substrate, and
a first distance from an end surface of the power region corresponding part to the substrate is shorter than a second distance from an end surface of the control region corresponding part to the substrate.
2. The electronic control device according to claim 1, wherein
the power region corresponding part is formed with a recessed portion that is recessed from the end surface of the power region corresponding part and receives the semiconductor modules therein.
3. The electronic control device according to claim 2, wherein
the end surface of the power region corresponding part is at a same height as end surfaces of the support parts.
4. The electronic control device according to claim 1, wherein
a plural number of the support parts are disposed in the power region corresponding part.
5. The electronic control device according to claim 1, wherein
the heat radiation layer is provided by a heat radiation gel, and
the heat radiation gel is filled in between the rear surface of the semiconductor module and a heat radiation part of the housing opposed to the rear surface of the semiconductor module.

6. The electronic control device according to claim 1, wherein
the substrate and the housing have a same outer size when viewed in a direction perpendicular to a planar direction of the substrate.

7. The electronic control device according to claim 1, wherein
the chips of the semiconductor elements in the plurality of semiconductor modules include semiconductor switching elements constituting one of an H-bridge circuit and an inverter circuit.

* * * * *